(12) United States Patent
Kwak

(10) Patent No.: US 7,679,669 B2
(45) Date of Patent: Mar. 16, 2010

(54) CAMERA MODULE PACKAGE

(75) Inventor: Hyung Chan Kwak, Yongin (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 340 days.

(21) Appl. No.: 11/783,054

(22) Filed: Apr. 5, 2007

(65) Prior Publication Data
US 2007/0268399 A1 Nov. 22, 2007

(30) Foreign Application Priority Data
May 18, 2006 (KR) ............. 10-2006-0044616

(51) Int. Cl.
*H04N 5/225* (2006.01)
(52) U.S. Cl. .................................... 348/340
(58) Field of Classification Search .......... 348/340, 348/373–375
See application file for complete search history.

(56) References Cited

U.S. PATENT DOCUMENTS

| 7,110,033 | B2* | 9/2006 | Miyake | 348/340 |
| 2002/0012061 | A1* | 1/2002 | Kato et al. | 348/342 |
| 2003/0234886 | A1* | 12/2003 | Cho et al. | 348/340 |
| 2004/0223072 | A1* | 11/2004 | Maeda et al. | 348/340 |
| 2004/0240004 | A1* | 12/2004 | Ching | 358/513 |
| 2005/0161756 | A1 | 7/2005 | Sun et al. | |
| 2005/0258502 | A1 | 11/2005 | Kong et al. | |
| 2006/0103754 | A1* | 5/2006 | Wenstrand et al. | 348/349 |

FOREIGN PATENT DOCUMENTS

| JP | 9-8440 | 1/1997 |
| JP | 2000-174161 | 6/2000 |
| JP | 2001-119006 | 4/2001 |
| JP | 2005-116628 | 4/2005 |
| JP | 2005-217888 | 8/2005 |
| JP | 2005-244116 | 9/2005 |
| KR | 2002-0095497 | 12/2002 |
| WO | 03/003421 A2 | 1/2003 |

OTHER PUBLICATIONS

Japanese Office Action issued on Jan. 13, 2009 in corresponding Japanese Patent Application No. 2007-096382.
Office Action issued in corresponding Chinese Patent Application No. 200710096950.9; mailed on Jun. 6, 2008.
Japanese Office Action, mailed Sep. 9, 2008, issued in corresponding Japanese Patent Application No. 2007-096382.
British Office Action issued Sep. 28, 2009 in corresponding British Patent Application GB0709326.3.

* cited by examiner

*Primary Examiner*—Tuan Ho
(74) *Attorney, Agent, or Firm*—Staas & Halsey LLP

(57) ABSTRACT

A camera module package comprises an image sensor having a light receiving section formed in the central portion of the upper surface thereof and a plurality of bumps formed around the light receiving section; an FPCB that is closely bonded to the image sensor by a flip chip, the FPCB having a plurality of via holes perforated at bonding positions corresponding to the bumps such that the bumps and the via holes are closely bonded to each other one to one; and an optical unit having a housing received on the FPCB and a lens barrel screwed to the central portion of the housing.

7 Claims, 3 Drawing Sheets

[FIG. 1]
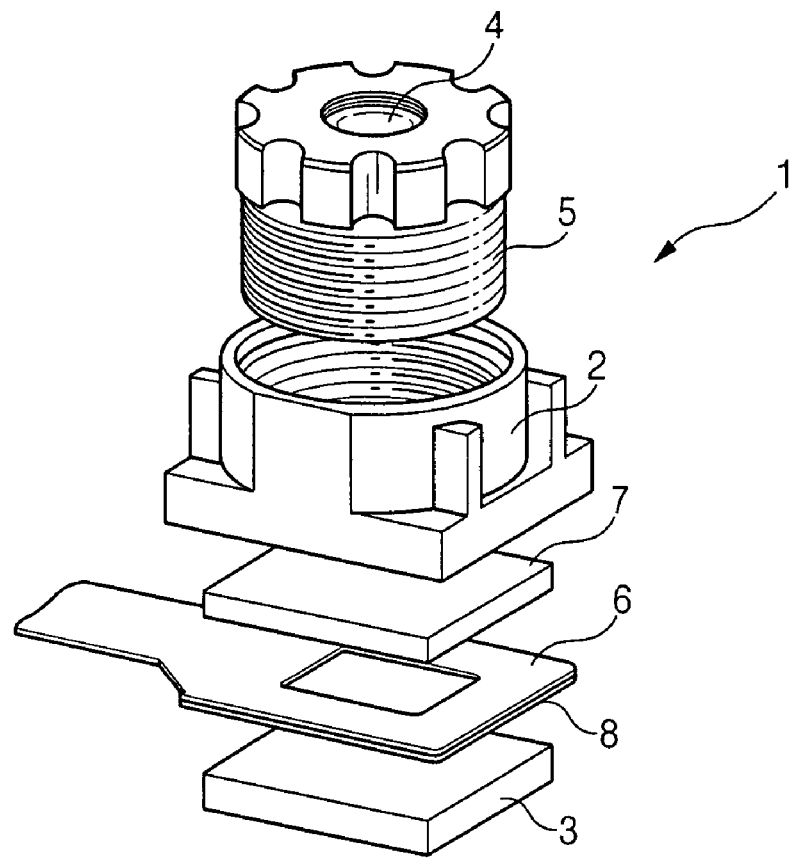
[FIG. 2]
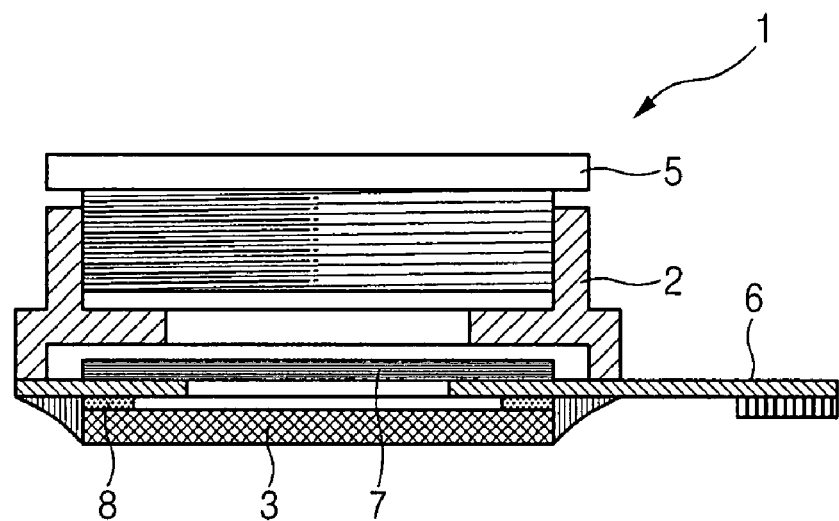

[FIG. 3]
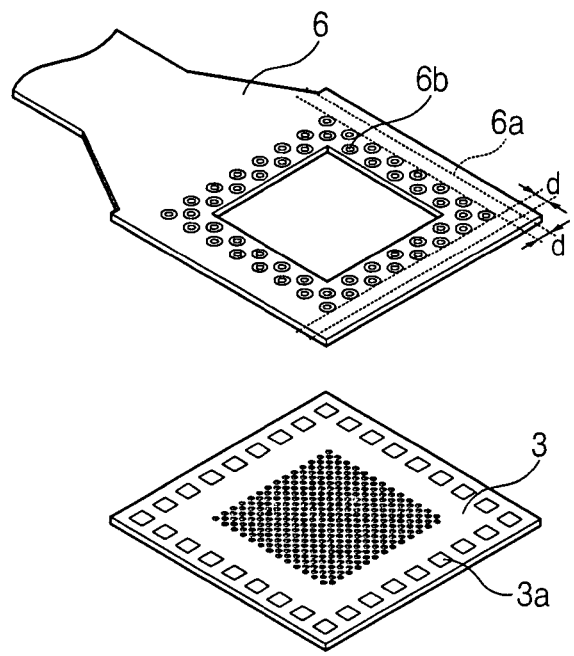
[FIG. 4]
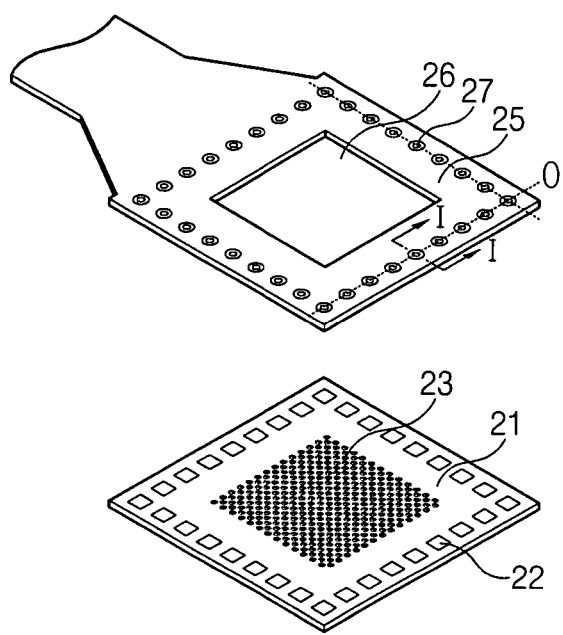

[FIG. 5]
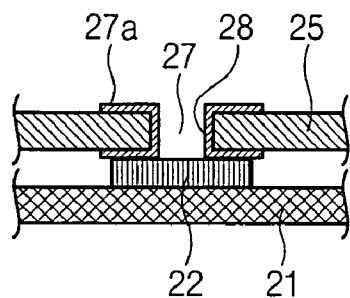
[FIG. 6]
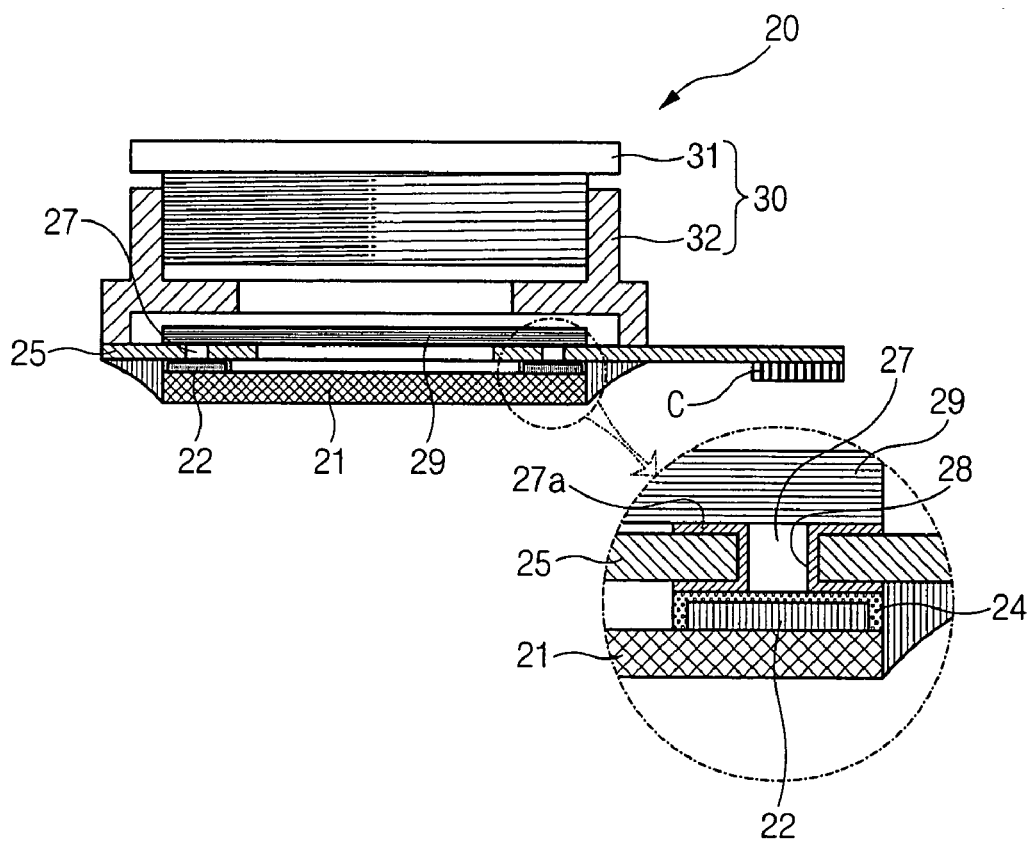

CAMERA MODULE PACKAGE

CROSS-REFERENCE TO RELATED APPLICATIONS

This application claims the benefit of Korean Patent Application No. 10-2006-0044616 filed with the Korea Intellectual Property Office on May 18, 2006, the disclosure of which is incorporated herein by reference.

BACKGROUND OF THE INVENTION

1. Field of the Invention

The present invention relates to a camera module package in which via holes and bumps are flip-chip-bonded so as to correspond to each other one to one. In the camera module package, when an image sensor is bonded to the lower surface of an FPCB (flexible printed circuit board) by a flip chip, via holes passing through the FPCB are formed in positions corresponding to connection bumps provided on the upper surface of the image sensor, thereby enhancing a degree of freedom in designing an FPCB.

2. Description of the Related Art

With the recent development of mobile terminals such as portable phones and personal digital assistants (PDAs), the mobile terminals provide a phone call function and are used as multi-convergence devices. The most representative of the multi-convergence is a camera module. The resolution of the camera module changes from 300,000 pixels (VGA) to 8,000,000 pixels. Moreover, the camera module provides various additional functions, such as auto-focusing (AF) and optical zoom. Generally, camera modules are applied to various IT devices, such as camera phones, smart phones, and mobile communication terminals.

The camera modules are manufactured by using main parts of charge coupled device (CCD) or complementary metal oxide semiconductor (CMOS) image sensors. Incident light transmitted through the lens is condensed by the image sensor and is stored as data in the memory. The stored data is displayed as an image through a display medium, such as liquid crystal display (LCD) or PC monitor.

Packaging methods of the image sensor for camera module include a chip on film (COF) method using a flip-chip bonding, a chip on board (COB) method using a wire bonding, and a chip select package (CSP). Among them, the COF packaging method and the COB packaging method are widely used.

Hereinafter, the COF packaging structure will be described briefly with reference to FIGS. 1 to 2.

FIG. 1 is an exploded perspective view of a conventional COF type camera module, and FIG. 2 is a partial sectional view of the conventional COF type camera module of FIG. 1.

Referring to FIGS. 1 and 2, the conventional camera module 1 includes an image sensor 3 for converting an image signal inputted through a lens into an electric signal, a housing 2 for supporting the image sensor 3, a lens group 4 for collecting an image signal of an object in the image sensor 3, and a barrel 5 in which the lens group 4 is stacked in multi-layers.

A flexible printed circuit board (FPCB) 6 is electrically connected to a lower portion of the housing 2. Chip components (e.g., condensers and resistors) for driving the CCD or CMOS image sensor 3 are mounted on the FPCB 6.

In the camera module 1, an anisotropic conductive film (ACF) 8 or non-conductive paste (NCP) is inserted between the FPCB 6 and the image sensor 3 in such a state that a plurality of circuit components are mounted on the FPCB 6. Then, heat and pressure are applied to electrically attach the FPCB 6 to the image sensor 3, and an IR filter 7 is attached on the FPCB.

Furthermore, in such a state that the barrel 5 and the housing 2 are provisionally screwed to each other, the assembled FPCB 6 is fixed to the bottom surface of the housing 2 by a separate adhesive.

Because the COF type camera module package does not need a space for attachment of wires, the package area and the barrel height can be reduced. Therefore, the camera module can be lightweight and slim.

In addition, because a thin film or FPCB is used, the package can be robust against external impact and can be highly reliable, and a manufacturing process of the package can be more simplified. Moreover, the COF type camera module package can attribute to high-speed processing, high density, and multiple pins, due to miniaturization and reduction in resistance.

However, as the COF type camera module package is integrated in a minimum chip size of wafer level package, a manufacturing cost increases and products may not be accurately delivered on the appointed date. Because the conventional COF package has a single-layered structure, the advantages of the miniaturization of the module package are not exhibited in the modules that use mega-pixel image sensors with various functions.

Further, when the FPCB 6 is a one-sided FPCB, a bonding surface of the FPCB 6 on which the image sensor 3 is bonded is limited to the lower surface of the FPCB 6. Therefore, the electric-connection start points of connection terminals provided in the image sensor 3 and the FPCB 6 inevitably start from the lower surface of the FPCB 6 such that a circuit-design space for the connection of the respective terminals is increased. Accordingly, the size of the FPCB 6 increases as a whole.

In order to solve the problem, a flip-chip-type module is manufactured by using a double-sided FPCB on which a plurality of via-holes are formed, as shown in FIG. 3. However, when the image sensor 3 is closely bonded to the lower surface of the double-sided FPCB 6, the plurality of via-holes are formed so as to be inevitably spaced at a distance of 150 μm from a connection bonding portion 6a such that circuit short caused by the interference between the via-holes 6b is prevented from occurring in the connection bonding portion 6a which comes in contact with a plurality of bumps 3a formed on the image sensor 3. Therefore, when a circuit using the via-holes 6b is designed, there is a spatial limitation in designing a circuit pattern.

SUMMARY OF THE INVENTION

An advantage of the present invention is that it provides a camera module package in which via holes and bumps are flip-chip-bonded so as to correspond to each other one to one. In the camera module package, when an image sensor is boned to the lower surface of an FPCB by a flip chip, via holes passing through the FPCB are formed in positions corresponding to connection bumps provided on the upper surface of the image sensor, thereby enhancing a degree of freedom in designing an FPCB.

Additional aspect and advantages of the present general inventive concept will be set forth in part in the description which follows and, in part, will be obvious from the description, or may be learned by practice of the general inventive concept.

According to an aspect of the invention, a camera module package comprises an image sensor having a light receiving section formed in the central portion of the upper surface thereof and a plurality of bumps formed around the light receiving section; an FPCB that is closely bonded to the image sensor by a flip chip, the FPCB having a plurality of via holes perforated at bonding positions corresponding to the bumps such that the bumps and the via holes are closely bonded to each other one to one; and an optical unit having a housing received on the FPCB and a lens barrel screwed to the central portion of the housing.

According to another aspect of the invention, the FPCB and the image sensor are bonded and fixed to each other, with ACF or NCP being interposed in the bonding portion between the via hole and the bump.

According to a further aspect of the invention, the via holes are composed of through-holes which vertically pass through the FPCB.

According to a still further aspect of the invention, the via hole has a metallic film formed on the inner surface thereof, the metallic film being composed of an Au (gold) or Sn (tin) plated layer.

According to a still further aspect of the invention, the housing has an IR-cut filter closely mounted on the upper surface of the FPCB.

According to a still further aspect of the invention, the housing is received on the upper surface of the FPCB in a state where an IR-cut filter is attached on the bottom surface of the housing.

According to a still further aspect of the invention, the FPCB is a double-sided FPCB.

According to a still further aspect of the invention, the bump is manufactured in a plated-bump shape or stud-bump shape.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is an exploded perspective view of a conventional COF type camera module;

FIG. 2 is a partial sectional view of the conventional COF type camera module of FIG. 1;

FIG. 3 is an exploded perspective view of the conventional COF type camera module when an image sensor is flip-chip-bonded;

FIG. 4 is an assembled perspective view of a camera module package according to the invention when an image sensor is flip-chip-bonded;

FIG. 5 is an enlarged sectional view taken along I-I line of FIG. 4; and

FIG. 6 is a sectional view of the camera module package according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, an embodiment of the present invention will be described in detail with reference to the accompanying drawings.

FIG. 4 is an assembled perspective view of a camera module package according to the invention when an image sensor is flip-chip-bonded, FIG. 5 is an enlarged sectional view taken along I-I line of FIG. 4, and FIG. 6 is a sectional view of the camera module package according to the invention.

As shown in the drawings, the camera module package 20 of the invention includes an image sensor 21 having a plurality of bumps formed on the upper surface thereof and an FPCB 25 having a plurality of via holes 27 formed to be connected to the bumps 22. The image sensor 21 and the FPCB 25 are closely bonded to each other, thereby forming an image sensor module. On the upper surface of the FPCB 25, a housing 32 to which a lens barrel 31 is integrally coupled is received.

The image sensor 21 has a light receiving section 23 formed in the center thereof and the plurality of bumps 22 disposed in a line along the outer edge portion of the light receiving section 23. The light receiving section 23 has a plurality of micro lenses which are densely arranged.

The bumps are formed in a plate-bump or stud-bump shape. When the bumps are caused to come in close contact with the lower surface of the FPCB 25 corresponding to the upper surface of the image sensor 21, the image sensor 21 and the FPCB 25 are electrically connected to each other such that the image sensor 21 can be electrically connected to external equipments.

The FPCB 25 to which the image sensor 21 is flip-chip-bonded has a light receiving region 26 perforated in the center thereof such that the light receiving section 23 of the image sensor 21 is exposed. Preferably, the FPCB 25 is composed of a double-sided FPCB having a predetermined circuit pattern formed on both sides thereof such that a uniform plate layer is formed on both sides. Further, the FPCB 25 has the plurality of via holes 27 formed in the edge portion thereof.

The via holes 27 are formed in positions corresponding to the formation positions of the bumps 22 formed on the image sensor 21 such that the via holes 27 and the bumps 22 correspond to each other one to one. That is, the via holes 27 are formed along a bump-connection line 0 at the outer edge portion of the light receiving region 26 through which the light receiving section 23 is exposed when the image sensor 21 is flip-chip-bonded.

The via holes 27 are composed of through-holes passing through the FPCB 25 and having a diameter of less than 50 μm. The via holes 27 serve to electrically connect the upper and lower portions of the FPCB 25.

In order to achieve the electrical connection between the upper and lower portions of the FPCB 25 through the via holes 27, the inner surface of each of the via holes 27 is formed of a metallic film 28 made of Au (gold). The metallic film 28 is formed by a sputtering process after the via hole 27 is bored. Further, a via land 27a is formed around the via hole 27 by the patterning which is performed toward the outside of the metallic film.

The via holes 27 are arranged in a line along the connection line 0 so as to correspond to the bumps 22, respectively, formed on the image sensor 21 which is closely coupled to the lower surface of the FPCB 25 by a flip chip. Therefore, a degree of freedom in designing via holes of the FPCB 25 is enhanced, thereby minimizing the size of the FPCB.

The start point of the connection between circuit patterns formed on the FPCB 25 can be designated from the via hole 27 of the FPCB 25 in a state where the image sensor 21 is closely bonded to the lower surface of the FPCB 25 by a flip chip. Therefore, it is possible to further reduce the number of via holes 27 for connecting the image sensor 21, the FPCB 25, and external equipments in a circuit manner, compared with the conventional FPCB 6.

Further, a spatial limitation is removed, which is caused when the via holes 27 are formed on the FPCB 25. Therefore, noise caused by the interference between circuit patterns is reduced so that the image quality of the camera module can be improved.

On the FPCB 25 to which the image sensor 21 is bonded, an optical unit 30 is received in a state where the light receiving region 26 is closed by an IR-cut filter 29 or in a state where the IR-cut filter 29 is attached inside the optical unit 30.

The optical unit 30 is composed of a housing 32 and a lens barrel 31 screwed to the central portion of the housing 32, the lens barrel 31 having at least one or more lenses mounted therein. Further, a connector C for connecting external equipments is coupled to the free end side of the FPCB 25 mounted in the lower opening of the housing 32.

Instead of the coupling of the connector C, a pattern can be formed, to which a slide connector can be applied.

In the FPCB 25 to which the optical unit 30 is coupled, the plurality of via holes 27 perforated in the edge portion thereof are bonded to the bumps 22 of the image sensor 21 closely coupled to the lower surface of FPCB 25 such that the via holes 27 respectively correspond to the bumps 22. In this case, an ACF or NCP bond is interposed between the bump 22 and the via hole 27 such that the bump 22 and the via hole 27 are more reliably bonded and fixed to each other.

When the FPCB 25 and the image sensor 21 are flip-chip-bonded, a portion of the bump 22 formed on the image sensor 21 is impregnated into the via hole 27 due to relatively high temperature and pressure. An impact is removed in the connection portion between the via hole 27 and the bump 22 such that the via hole 27 is prevented from collapsing or being broken.

According to the camera module package of the invention, when the FPCB and the image sensor are closely bonded to each other by the flip-chip bonding, the via holes of the FPCB and the bumps of the image sensor are directly bonded and fixed such that the via holes and the bumps correspond to each other one to one. Therefore, a freedom of degree in circuit design of the FPCB is enhanced so that the sizes of the image sensor and the FPCB for a small-sized camera module package can be reduced. As a result, a spatial limitation in perforating via holes is removed. The circuit start point is freely selected so that a pattern can be designed in various manners. Further, the interference between circuits is minimized so that pattern noise can be significantly reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A camera module package comprising:
    an image sensor having a light receiving section formed in the central portion of the upper surface thereof and a plurality of bumps formed around the light receiving section;
    flexible printed circuit board (FPCB) that is closely bonded to the image sensor by a flip chip, the FPCB having a plurality of via holes perforated at bonding positions corresponding to the bumps such that the bumps and the via holes are closely bonded to each other one to one; and
    an optical unit having a housing received on the FPCB and a lens barrel screwed to the central portion of the housing,
    wherein the via hole has a metallic film formed on the inner surface thereof, the metallic film being composed of an Au (gold) or Sn (tin) plated layer, and
    a via land is formed around the via hole by patterning which is performed toward the outside of the metallic film.

2. The camera module package according to claim 1, wherein the FPCB and the image sensor are bonded and fixed to each other, with an anisotropic conductive film (ACF) or non-conductive paste (NCP) being interposed in the bonding portion between the via hole and the bump.

3. The camera module package according to claim 1, wherein the via holes are composed of through-holes which vertically pass through the FPCB.

4. The camera module package according to claim 1, wherein the housing has an infrared (IR)-cut filter closely mounted on the upper surface of the FPCB.

5. The camera module package according to claim 1, wherein the housing is received on the upper surface of the FPCB in a state where an IR-cut filter is attached on the bottom surface of the housing.

6. The camera module package according to claim, wherein the FPCB is a double-sided FPCB.

7. The camera module package according to claim 1, wherein the bump is manufactured in a plated-bump shape or stud-bump shape.

* * * * *

UNITED STATES PATENT AND TRADEMARK OFFICE
CERTIFICATE OF CORRECTION

PATENT NO.         : 7,679,669 B2
APPLICATION NO.    : 11/783054
DATED              : March 16, 2010
INVENTOR(S)        : Hyung Chan Kwak It is certified that error appears in the above-identified patent and that said Letters Patent is hereby corrected as shown below:

Column 6, Line 13, before "flexible" insert --a--.

Column 6, Line 44, change "claim," to --claim 1,--.

Signed and Sealed this

Thirteenth Day of July, 2010

David J. Kappos
*Director of the United States Patent and Trademark Office*